(12) United States Patent
Ichiki et al.

(10) Patent No.: US 10,714,238 B2
(45) Date of Patent: Jul. 14, 2020

(54) JOINT FOR SUPERCONDUCTING WIRE (71) Applicant: Hitachi Ltd., Chiyoda-ku, Tokyo (JP)

(72) Inventors: Yota Ichiki, Tokyo (JP); Tsuyoshi Wakuda, Tokyo (JP)

(73) Assignee: HITACHI, LTD., Tokyo (JP)

( * ) Notice: Subject to any disclaimer, the term of this patent is extended or adjusted under 35 U.S.C. 154(b) by 454 days.

(21) Appl. No.: 15/544,678

(22) PCT Filed: Feb. 3, 2016

(86) PCT No.: PCT/JP2016/053127
§ 371 (c)(1),
(2) Date: Jul. 19, 2017

(87) PCT Pub. No.: WO2016/143416
PCT Pub. Date: Sep. 15, 2016

(65) Prior Publication Data
US 2018/0012682 A1    Jan. 11, 2018

(30) Foreign Application Priority Data
Mar. 10, 2015  (JP) ................. 2015-046620

(51) Int. Cl.
H01B 12/02       (2006.01)
H01L 39/02       (2006.01)
H01L 39/14       (2006.01)
H01R 4/68        (2006.01)
H01R 4/28        (2006.01)

(52) U.S. Cl.
CPC ............. *H01B 12/02* (2013.01); *H01L 39/02* (2013.01); *H01L 39/141* (2013.01); *H01R 4/28* (2013.01); *H01R 4/68* (2013.01)

(58) Field of Classification Search
None
See application file for complete search history.

(56) References Cited

U.S. PATENT DOCUMENTS

2003/0148891 A1    8/2003    Iida et al.
2012/0108435 A1    5/2012    Ichiki et al.

FOREIGN PATENT DOCUMENTS

| JP | 2012-094413 A | 5/2012 |
| WO | WO-03/002483 A1 | 1/2003 |
| WO | WO-2013/161475 A1 | 10/2013 |
| WO | WO-2015/015627 A1 | 2/2015 |

OTHER PUBLICATIONS

International Search Report dated Apr. 19, 2016 as issued in International Application No. PCT/JP2016/053127.

*Primary Examiner* — Colleen P Dunn
(74) *Attorney, Agent, or Firm* — Foley & Lardner LLP (57) ABSTRACT

The problem is to attain a joint for multi-core superconducting wires having a high critical current property. The joint for superconducting wires of the present invention has a first sintered body containing $MgB_2$ configured to fix a plurality of superconducting wires, and a second sintered body containing $MgB_2$ configured to joint the superconducting wires.

8 Claims, 9 Drawing Sheets

JOINT FOR SUPERCONDUCTING WIRE

TECHNICAL FIELD

The present invention relates to a joint structure of a joint for superconducting wires using magnesium diboride ($MgB_2$).

BACKGROUND ART

Magnesium diboride ($MgB_2$) has a critical temperature (transition temperature) of 39 K, which is higher than the critical temperatures of conventional superconductors (for example, niobium-titanium (NbTi) and triniobium-tin ($Nb_3Sn$) and the like). Furthermore, unlike a wire using an oxide superconductor, a wire using $MgB_2$ has an advantage that, when a closed circuit using the wire is operated at a persistent current mode, the wire has high electrical field stability.

The persistent current mode is an operation method in which a current is continuously flown in a closed circuit formed by using a superconductor. That is, since a superconducting wire has a resistance of zero, once a current is flown in a closed circuit, the current is continuously flown without attenuation. In order to attain such persistent current mode, a technique to joint end parts of superconducting coils or superconducting wires constituting a persistent current switch with a superconductor is important. In addition, superconducting wires are generally used as multi-core wires constituted by a plurality of filaments in view of current capacity, wire length, magnetic stability and alternate current loss, and thus are demanded to be capable of joint multi-core wires.

PTL 1 describes a method including polishing tip ends of wires containing a mixed powder of magnesium (Mg) and boron (B) or $MgB_2$ wires to expose $MgB_2$ cores, inserting the wires in a container, filling the container with a mixed powder of Mg and B from the direction orthogonal to the wires, pressurizing the mixed powder, and conducting a heat treatment. By the heat treatment, a sintered body of $MgB_2$ is formed, and the wires are jointed.

CITATION LIST

Patent Literature

PTL 1: JP 2012-094413 A

SUMMARY OF INVENTION

Technical Problem

In the technique described in PTL 1, the cores of the tip end parts of the wires ($MgB_2$, or a mixed powder containing Mg and B) are exposed in the metal container and are jointed through the $MgB_2$ sintered body. However, either of the documents mentions about joints of single core wires, and does not describe any specific method relating to joints of multi-core wires. As mentioned above, in most of actual cases, a superconducting coil is produced by using multi-core wires, and in order to subject the superconducting coil to a persistent current operation, a technique to joint multi-core wires is necessary.

The problem in jointing multi-core wires is fixing of filaments (these refer to single core wires constituting a multi-core wire) in a joint process. There are two kinds of methods mentioned below as the method for preparing a multi-core wire. The methods are a twisted wire method in which single core wires are each subjected to a wire drawing processing so that the single core wires become thin to a final wire diameter, and then the single core wires are twisted, and an composite wire method in which a plurality of single core wires that have been subjected to a wire drawing processing halfway are composed in a pipe, and the pipe is further subjected to a wire drawing processing. Generally, constitutional materials of a superconducting wire contain Cu (or a Cu alloy) for electrical and thermal stabilization, but when superconducting wires are jointed by a $MgB_2$ sintered body, Mg reacts with Cu. Therefore, in general, it is necessary to dissolve Cu by a chemical polisher and remove Cu. Therefore, in either of the twisted wire method and composite wire method, it is necessary that filaments each constituted by a $MgB_2$ core and a barrier material surrounding the core (Fe, Nb and the like) are jointed in a scattered state. In jointing the filaments, it is necessary to expose the $MgB_2$ cores by polishing, but it is highly possible that thin filaments (generally having a wire diameter of about several hundred micrometers) are damaged.

In order to fix the filaments, it is considered to fix the filaments with a heat-resistant adhesive (ceramic bond). However, a binder contained in the adhesive (sodium silicate or the like) remains in the $MgB_2$ sintered body for joint or at a joint interface as an impurity to thereby deteriorate the critical current property of the joint.

The object of the present invention is to solve the above-mentioned problem relating to the joint of $MgB_2$ multi-core wires to thereby attain a joint having a high critical current property without damaging filaments of multi-core wires.

Solution to Problem

The present inventors considered so as to solve the above-mentioned problem, and consequently found that the above-mentioned problem can be solved by a method for treating end parts of a multi-core wire, and completed the present invention. The joint for superconducting wires according to the present invention has a $MgB_2$ sintered body for mechanically fixing filaments besides a $MgB_2$ sintered body that contributes to an electric joint.

Advantageous Effects of Invention

According to the present invention, a joint having a high critical current property can be attained without damaging filaments of multi-core wires.

DESCRIPTION OF EMBODIMENTS

A superconducting magnet is used in an MRI (Magnetic Resonance Imaging) apparatus, an NMR (Nuclear Magnetic Resonance) apparatus and the like. Since a high magnetic field stability is necessary in such devices, the superconducting magnet is operated at "persistent current mode" in which a closed circuit is constituted by only a superconductor, and a current is continuously flown. For this purpose, a technique for jointing a superconducting coil, a persistent current switch and a wiring for jointing those via a superconductor is required.

In a conventional superconducting magnet apparatuses, superconducting wires of NbTi and $Nb_3Sn$ are used, and many of which are operated by cooling to 4.2 K with liquid helium. In such superconducting magnets, a jointing technique by a superconducting solder represented by a PbBi alloy has been established.

Magnesium diboride ($MgB_2$) has a higher critical temperature at which it transits to superconductive than the critical temperatures of conventional metal-based materials, and thus practical use of magnesium diboride as a superconducting magnet by cooling in a refrigerator without using liquid helium is expected. Since operating at 10 K or more is required in such case, conventional superconducting solder joint in which the critical temperature is 10 K or less cannot be applied. Therefore, it is necessary to establish a technique for jointing $MgB_2$ wires by $MgB_2$.

SUMMARY

By fixing filaments of superconducting wires containing $MgB_2$ by a first sintered body containing $MgB_2$ in advance before joint, the damaging of the filaments during polishing for exposing wire cores is avoided, whereby it becomes possible to attain a superconducting joint having a high critical current property.

Superconducting Magnet

Figure 1:
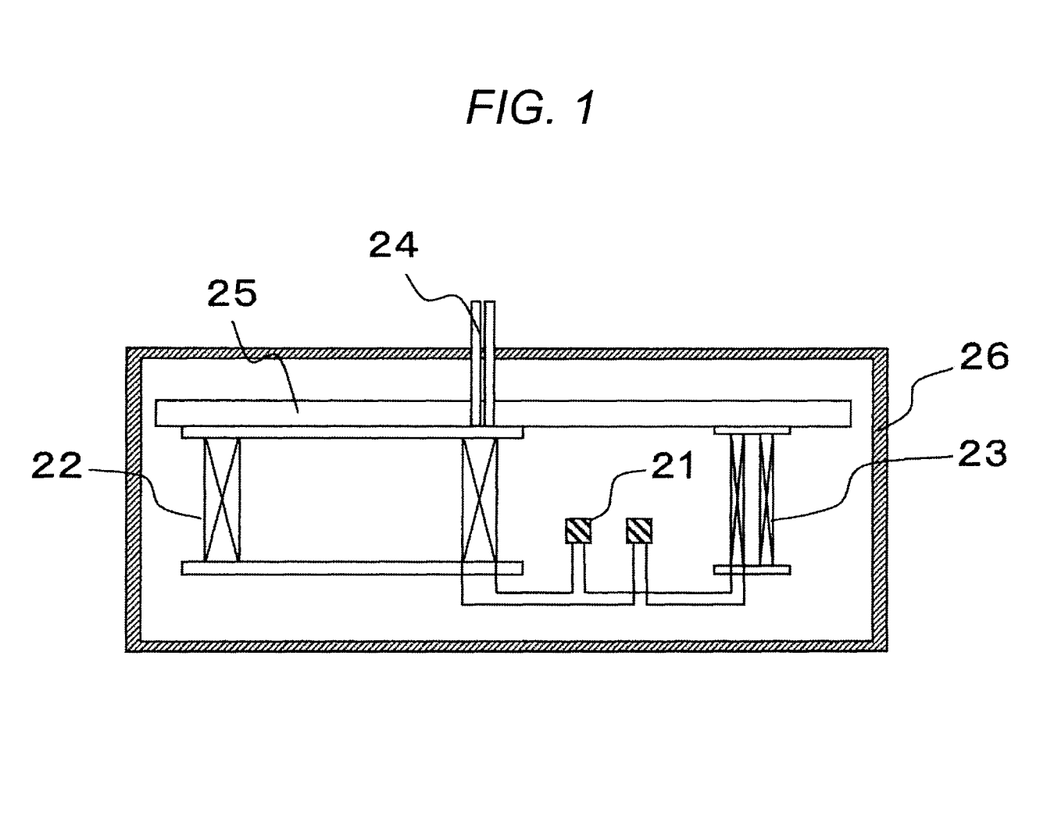
FIG. 1 is a constitutional example of a superconducting magnet.

The superconducting magnet having the joint structure for superconducting wires as mentioned above has high reliability of a joint, and can be stably operated without quenching. FIG. 1 shows a constitutional example of the superconducting magnet. The superconducting magnet of FIG. 1 includes a cryostat 26 in which a superconducting coil 22 and a persistent current switch 23 are disposed, and these are cooled by a refrigerator, which is not illustrated, through a support plate 25. During the excitation of the superconducting coil 22, a current is fed through a current lead 24 that connects a power source, which is not illustrated, at the side of room temperature, and the superconducting coil 22 at a low temperature side. The superconducting joint 21 is disposed on two portions between the superconducting coil 22 and the persistent current switch 23.

Examples

Multi-core twisted wires having seven twisted single core wires (filaments) each having a $MgB_2$ core in a metal sheath are explained here as an example of superconducting wires to be jointed. A metal sheath is generally constituted by a stabilizing material for ensuring high electric and thermal stability such as copper, and a barrier material for preventing a reaction with the stabilizing material during a heat treatment for converting Mg and B to $MgB_2$. Furthermore, although a case when the same seven-core twisted wires are jointed is explained here, the number of the cores in each wire is not limited to seven (single core wires are also encompassed). In addition, not only twisted wires but also composite wires are handled in a similar manner to that for handling twisted wires at the time when Cu or Cu alloy as a base material is disassembled by solving; therefore, composite wires are omitted here. Furthermore, the superconducting wire to be jointed is not limited to $MgB_2$, and the present invention can also be applied to NbTi and $Nb_3Sn$, which are used in conventional superconducting magnets. Furthermore, the number of the superconducting wires to be jointed is not limited to two, and may be three or more.

FIGS. 2 to 5 show the steps of the treatment of the wire end parts in this Example. At the stage before the treatment of these end parts, the wire cores may already be in an $MgB_2$ state (calcination has been completed). However, since wires in an $MgB_2$ state are mechanically brittle, it is desirable that the wires are in a state of Mg+B (uncalcined).

Figure 2:
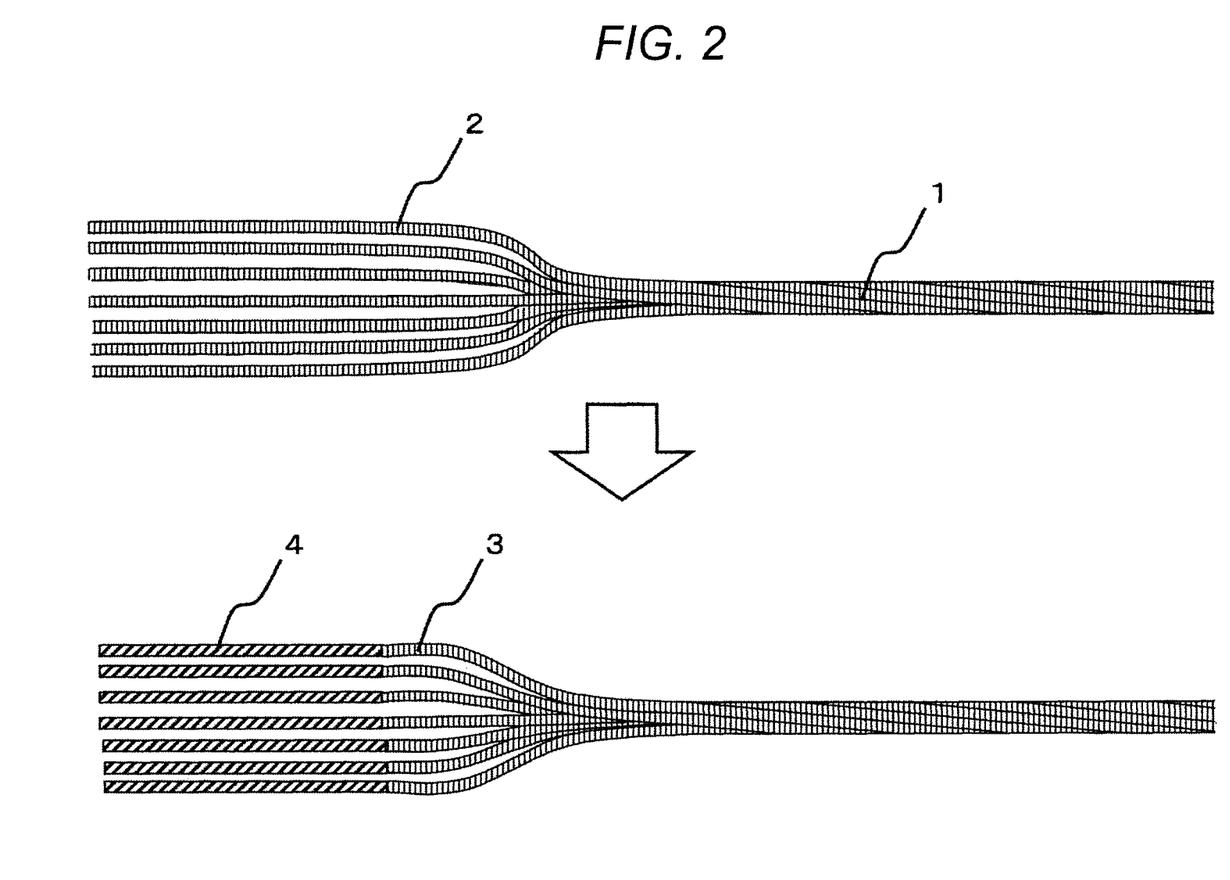
FIG. 2 shows a step for pre-treating a multi-core twisted wire.

FIG. 2 shows a step of a pre-treatment of a multi-core twisted wire. In FIG. 2 (upper drawing), filaments 2 that are positioned at the end part of a multi-core $MgB_2$ wire 1 constituted by a multi-core twisted wire are sleaved and disassembled. Each of the filaments 2 has a structure in which a barrier material 4 is coated with a stabilizing material 3 constituted by Cu. In FIG. 2 (lower drawing), the stabilizing material 3 on the filament 2 positioned at the end part of the multi-core $MgB_2$ wire 1 is removed by a chemical polisher to thereby put the filaments 2 into a state that the barrier material 4 is exposed.

Figure 3:
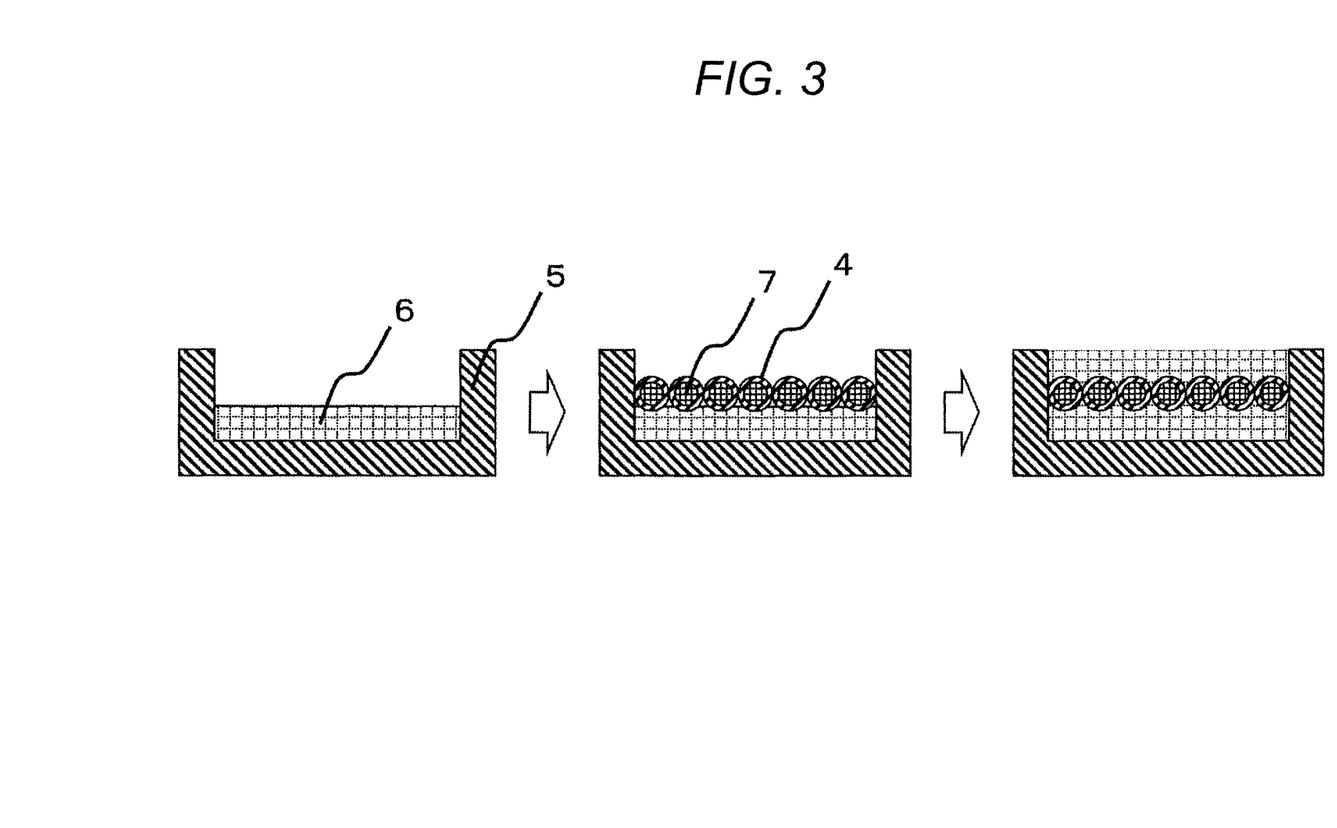
FIG. 3 shows a step of forming an $MgB_2$ sintered body.

FIG. 3 shows the steps of forming a $MgB_2$ sintered body. In FIG. 3, seven filaments are fixed with a raw material powder for a first $MgB_2$ sintered body in a wire support element 5. FIG. 3 is a drawing seen from the direction of the tip ends of the wires.

In FIG. 3 (left drawing), the wire support element 5 is lined with a mixed powder 6 of Mg and B, which is a raw material powder for the $MgB_2$ sintered body, and the mixed powder 6 is pressurized by a press machine or the like. Since the $MgB_2$ sintered body does not contribute to critical current and is only for mechanical supporting, it is sufficient that the sintered body has been integrated after the calcination, and the pressure of the press machine may be small. For the wire support element 5, Nb, Fe, Ta and alloys thereof, which are difficult to react with Mg and B during the heat treatment, can be used.

Secondly, in FIG. 3 (central drawing), seven filaments each constituted by a wire core 7 and a barrier material 4 before calcination are lined transversely. In FIG. 3 (right drawing), the mixed powder 6 of Mg and B is further laminated on the filaments and pressurized. Although the seven filaments are lined in one layer here, the filaments may be lined in two layers by dividing the filaments, for example, into four and three filaments. Furthermore, it is desirable that the length of the wire end parts to be fixed is longish with consideration for the case when the joint fails and is done again. Subsequently, a heat treatment for converting to $MgB_2$ is conducted. In the steps of FIG. 3, the wire cores 7 are in an uncalcined state, and thus are converted to $MgB_2$ simultaneously with the heat treatment at this time. In the case when the wire cores 7 that have been calcined are used in the steps of FIG. 3, it is also possible to subject only the end parts to a local heat treatment. The heat treatment is generally conducted by using an electric furnace in an inert gas such as argon or nitrogen at 600° C. to 800° C. Since the electrical property of the MgB$_2$ sintered body for fixing the wire end parts is not questioned, the calcination may be conducted under heat treatment conditions at which the critical current property of the wires is maximum.

Figure 4:
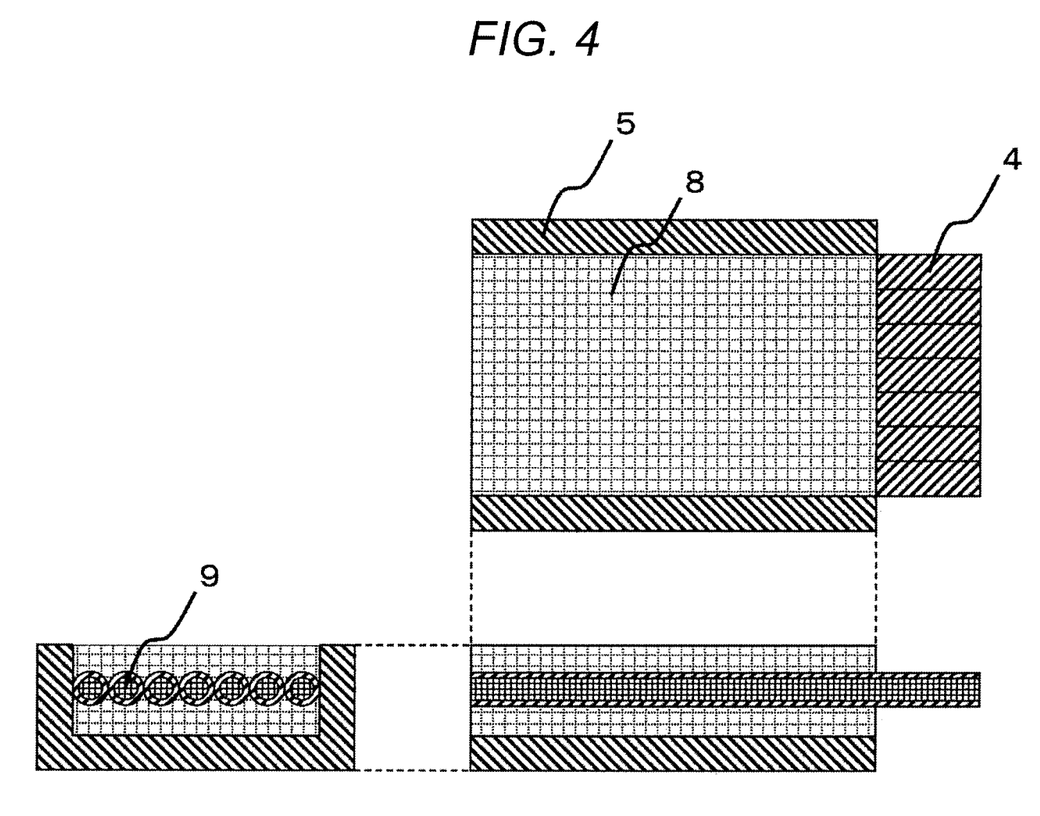
FIG. 4 shows the structure of the multi-core $MgB_2$ wire after the heat treatment.

FIG. 4 shows the structure of the multi-core MgB$_2$ wire after the heat treatment. FIG. 4 (upper drawing) shows an upper surface view of the wire end parts after the calcination, FIG. 4 (bottom left drawing) shows a central cross-sectional view, and FIG. 4 (bottom right drawing) shows a side view seen from the side of the tip ends. The wire end parts have been fixed by a MgB$_2$ sintered body 8, and wire cores 9 after the sintering have also been converted into MgB$_2$.

Figure 5:
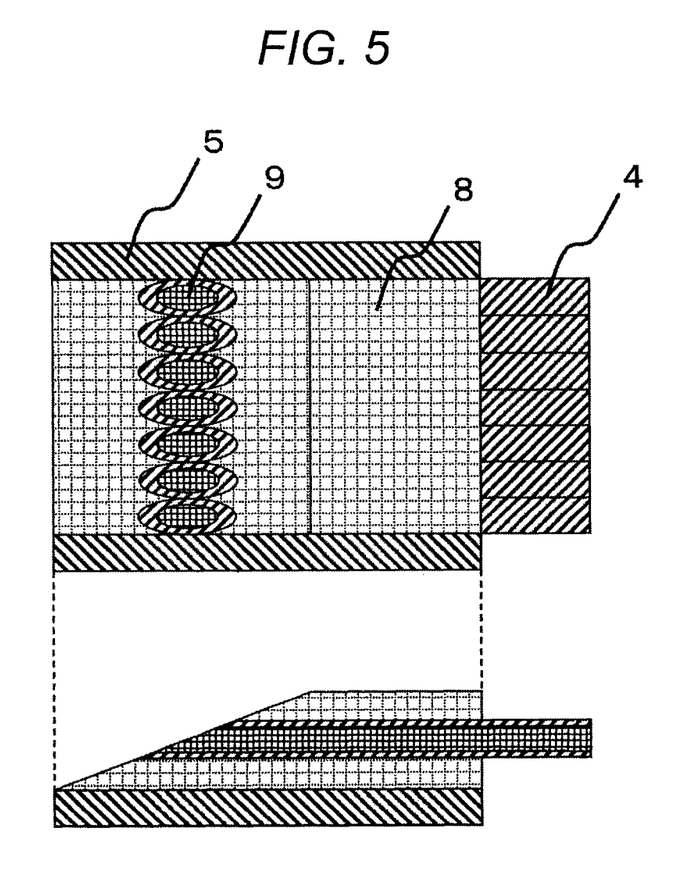
FIG. 5 shows the structure of the multi-core $MgB_2$ wire after the polishing.

FIG. 5 shows the structure of the multi-core MgB$_2$ wire after the polishing. FIG. 5 (upper drawing) shows an upper surface view of the wire end parts after the polishing, and FIG. 5 (lower drawing) shows a cross-sectional view. The polishing method may be general mechanical polishing. It is desirable that the angle of the polished surface with respect to the length direction of the wires is a small angle with consideration for the surface area of the wire cores 9 to be exposed, but if the angle is small, necessary space and amount of substance increase. Therefore, the angle is suitably from 10° to 30°.

The above-mentioned explanation is for fixing one multi-core wire, and in the case when a coil and a persistent current switch which have been separately calcined are to be jointed, it is necessary to fix one multi-core wire in such way (however, this does not apply to the case when calcined wires are fixed at the end parts).

Figure 6:
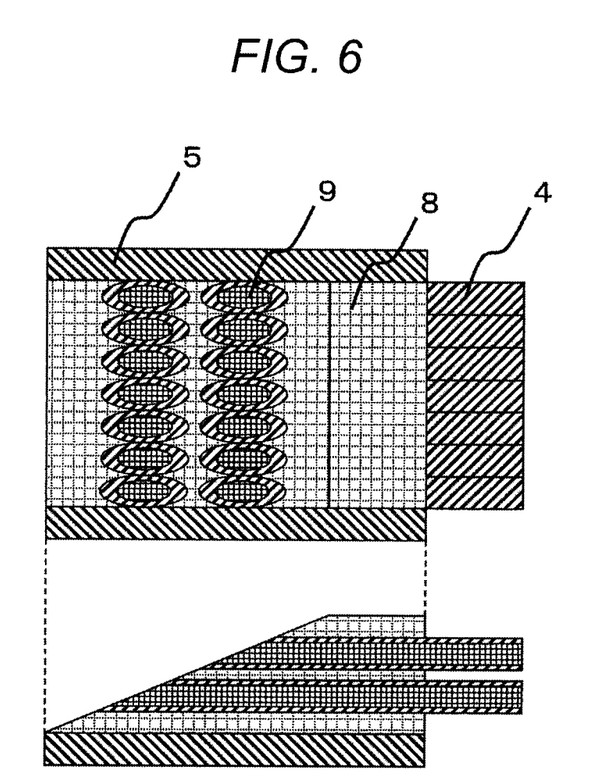
FIG. 6 shows another example of the structure of the multi-core $MgB_2$ wire after the polishing.

FIG. 6 is another example of the structure of the multi-core MgB$_2$ wires after the polishing. Here, the case when two multi-core wires are fixed in the same sintered body is shown. In the case when calcination is conducted in a state that a coil and a persistent current switch are assembled, the two multi-core wires to be jointed can be fixed by the same sintered body as shown in FIG. 6.

Figure 7:
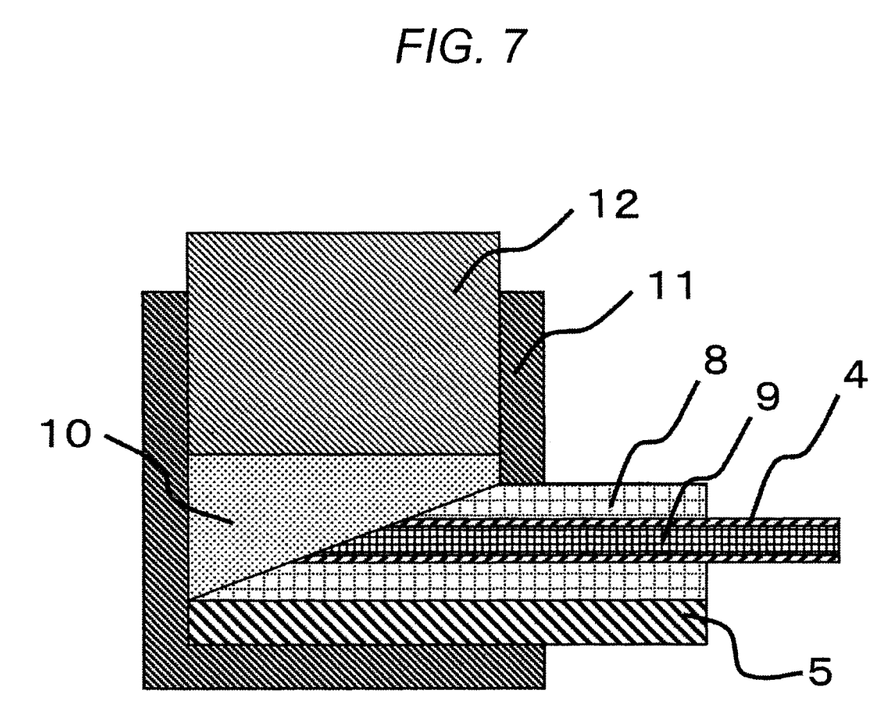
FIG. 7 shows structure (1) of a joint for superconducting wires.
Figure 8:
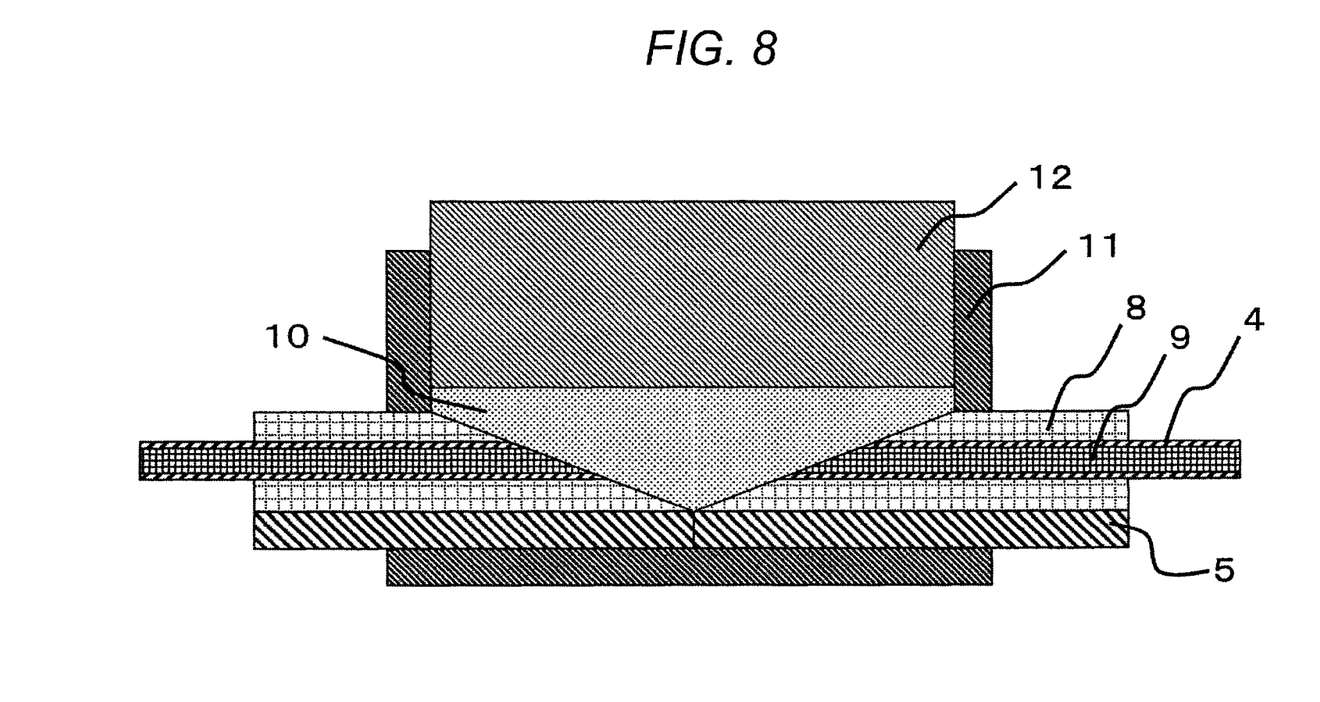
FIG. 8 shows structure (2) of a joint for superconducting wires.
Figure 9:
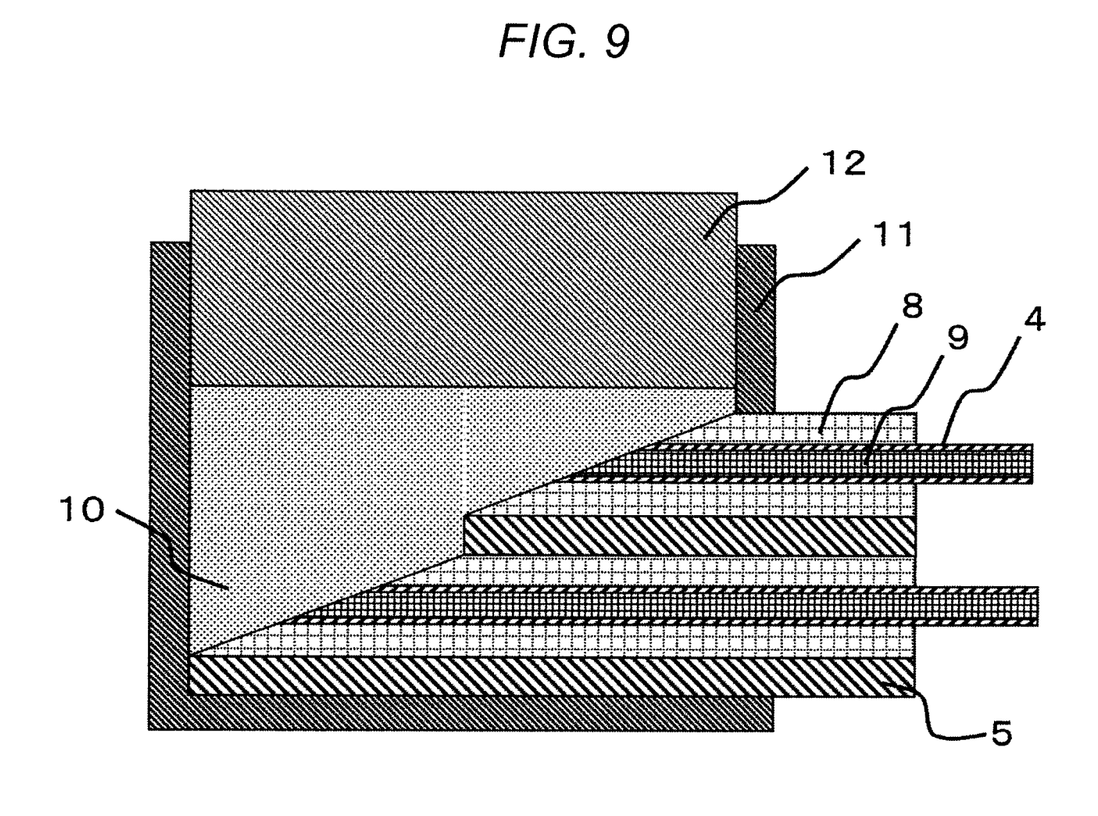
FIG. 9 shows structure (3) of a joint for superconducting wires.

The wires fixed at the end parts in which the wire cores 9 of the filaments are in an exposed state as mentioned above can be jointed, for example, in a joint container constituted by a metal as in the conventional techniques. The cross-sectional views after the joint are shown in FIGS. 7 to 9. In each of the drawings, the insertion directions and the manners of the lining of the multi-core wires are different. The procedures for the joint are as follows.

Firstly, the wire end parts fixed by the MgB$_2$ sintered body 8 are inserted in the joint container 11. The directions and positions for the insertion of the two wires can be arbitrary determined depending on the space and wiring in a superconducting magnet.

FIG. 7 shows joint (1) for superconducting wires. This is a joint in the case when two multi-core wires are inserted from the same direction and lined transversely, and another wire is present in the depth direction of the plane of paper besides the wire shown in the drawing. The transversely refers to FIG. 8 shows joint (2) for superconducting wires. This is a joint in the case when two multi-core wires are inserted from the opposing directions.

FIG. 9 shows joint (3) for long electrical transmission wires. This is a joint in the case when two multi-core wires are inserted from the same direction and lined vertically, and insertion from the opposing directions as shown in, insertion from the same direction with lining vertically as shown in FIG. 9, and the like can be considered.

However, in order to ensure fine contact between a MgB$_2$ sintered body 10 for joint and wire cores 9, it is desirable that the direction of insertion of a pin 12 for pressurizing the raw material powder for the MgB$_2$ sintered body 10 and the direction of insertion of the wires are close to orthogonal as possible (80° to 100°). Therefore, it is preferable that the joint 11 has a first opening that is positioned in the direction to which a plurality of superconducting wires and the MgB$_2$ sintered body 8 are disposed, and a second opening in the direction to which the MgB$_2$ sintered body 10 is disposed, and that the opening direction of the first opening and the opening direction of the second opening forms an angle of from 80° to 100°.

Furthermore, since the critical current property of the joint is determined by the property of the MgB$_2$ sintered body 10, it is preferable that the density of the MgB$_2$ sintered body 10 is higher than the density of the MgB$_2$ sintered body 8 for fixing the wires. For this purpose, it is preferable to fill the surroundings of the wire cores with a B powder and then dispose Mg on the surroundings thereof, rather than a step of filling with a mixed powder of Mg and B as the raw material powder for the MgB$_2$ sintered body 10. In the former, since volume contraction occurs by the diffusion of Mg in B during the formation of MgB$_2$, the obtained sintered body has a density of about 50% with respect to the theoretical density of MgB$_2$. On the other hand, in the latter, since the density locally increases by the permeation and diffusion of Mg in the B powder around the wire cores, a sintered body having a high density of 70 to 100% can be obtained. Furthermore, it can also be considered to use a Mg alloy having a lower melting point than that of Mg so as to improve the reactivity, and to add a compound containing carbon as represented by SiC for the purpose of improving the critical current property in a highly magnetic field.

In FIGS. 7 to 9, the MgB$_2$ sintered body 8 is positioned by surrounding the outer peripheries of the wires each constituted by the wire core 9 and the barrier material 4. The MgB$_2$ sintered body 10 is positioned along a polished surface constituted by the wire cores 9 and the barrier material 4 and the MgB$_2$ sintered body 8. Therefore, there are both a part in which the MgB$_2$ sintered body 8 and the MgB$_2$ sintered body 10 are disposed in a side-by-side relation, and a part in which the MgB$_2$ sintered body 8 and the wire are disposed in a side-by-side relation.

When a joint for seven-core twisted wires was prepared by the above-mentioned method, and the critical current property was evaluated, a critical current value corresponding to the number of the filaments (approximately seven times as large as the critical current value of a single core wire) was obtained. Therefore, it can be said from this fact that it has become possible by the present invention to joint multi-core wires without damaging filaments.

REFERENCE SIGNS LIST 1 multi-core MgB$_2$ wire
2 filament
3 stabilizing material
4 barrier material
5 wire support element
6 mixed powder of Mg and B
7 wire core
8 MgB$_2$ sintered body
9 wire core
10 MgB$_2$ sintered body
11 joint container
12 pressurizing pin
21 superconducting joint
22 superconducting coil 23 persistent current switch
24 current lead
25 support plate
26 cryostat

The invention claimed is:

1. A joint for superconducting wires, comprising:
a plurality of superconducting wires each coated with a metal sheath;
a wire support element configured to support the superconducting wires;
a first sintered body configured to fix the superconducting wires on the wire support element; and
a second sintered body configured to join the coated superconducting wires,
wherein the superconducting wires, the first sintered body, and the second sintered body contain $MgB_2$,
end parts of the superconducting wires and the first sintered body are polished, and
the second sintered body is disposed along a polished surface on the end parts of the superconducting wires and the first sintered body.

2. The joint for superconducting wires according to claim 1, wherein the second sintered body has a higher density than the density of the first sintered body.

3. The joint for superconducting wires according to claim 2, wherein the density of the second sintered body is 70% or more of the theoretical density of $MgB_2$.

4. The joint for superconducting wires according to claim 1, wherein the first sintered body covers the outer periphery of the superconducting wires.

5. The joint for superconducting wires according to claim 1, wherein the length direction of the superconducting wire and the polished surface forms an angle of from 10° to 30°.

6. A device comprising:
the joint for superconducting wires according to claim 1, and
a joint container in which the joint is disposed, the joint container having a first opening positioned in the direction to which the superconducting wires and the first sintered body are disposed, and a second opening positioned in the direction to which the second sintered body is disposed, wherein the opening direction of the first opening and the opening direction of the second opening forms an angle of from 80° to 100°.

7. The joint for superconducting wires according to claim 1, wherein the metal sheath comprises an inner barrier material layer and an outer stabilizing material layer, and the end parts of the superconducting wires are polished such that a portion of the barrier material layer is exposed.

8. The joint for superconducting wires according to claim 1, wherein cores of the superconducting wires, the first sintered body, and the second sintered body consist of $MgB_2$.

* * * * *